United States Patent [19]

Crownover et al.

[11] Patent Number: 5,304,274
[45] Date of Patent: Apr. 19, 1994

[54] METHOD FOR MANUFACTURING ELECTRODES FOR MULTILAYER CERAMIC CAPACITORS

[75] Inventors: Joseph W. Crownover, La Jolla; Ben B. Meckel, Encinitas; Aubrey M. Burer, El Cajon, all of Calif.

[73] Assignee: BMC Technology Corporation, San Diego, Calif.

[21] Appl. No.: 925,295

[22] Filed: Aug. 6, 1992

Related U.S. Application Data

[63] Continuation of Ser. No. 610,780, Nov. 8, 1990, abandoned.

[51] Int. Cl.⁵ ............... B44C 1/165; B29C 47/00; C23C 14/00
[52] U.S. Cl. .................... 156/230; 156/89; 156/235; 156/237; 156/246; 156/256; 156/306.3; 204/192.17; 264/61; 264/153; 264/259
[58] Field of Search ............ 156/89, 233, 230, 235, 156/237, 246, 256, 306.3; 427/79, 96, 99; 264/61, 153, 259; 204/192.1, 192.14, 192.17

[56] References Cited

U.S. PATENT DOCUMENTS

| | | | |
|---|---|---|---|
| 4,435,738 | 3/1984 | Barber, Jr. et al. | 29/25.42 |
| 4,478,878 | 10/1984 | Neuwald | 427/79 |
| 4,715,940 | 12/1987 | Boudreau | 427/248.1 |
| 4,749,591 | 6/1988 | Ronchi | 427/79 |
| 5,009,744 | 4/1991 | Mandai | 156/656 |

FOREIGN PATENT DOCUMENTS 1162927  9/1969  United Kingdom .
2228368A  8/1990  United Kingdom .

Primary Examiner—Jan H. Silbaugh
Assistant Examiner—Christopher A. Fiorilla
Attorney, Agent, or Firm—Frank D. Gilliam

[57] ABSTRACT

A method and apparatus for manufacturing electrodes for capacitors having a plurality of thin metal coatings on a ceramic dielectric substrate, with the coated substrates assembled in a monolithic structure. A layer of green ceramic material is formed on a support tape. This green ceramic tape is moved in registration with a stencil web overlying the tape. The stencil web has openings corresponding to the configuration of the conductive coating to be formed on the tape. The sandwich of tape and web is moved through a sputtering chamber in which a selected metal or alloy is sputtered from a target so as to fall on the stencil web, coating the ceramic tape wherever openings are present. The sputtering chamber is arranged so that initially the ceramic tape receives a light, low energy metal coating before being exposed to maximum sputtering. This allows a reflective coating to be formed to reflect thermal energy before the intensity of the thermal radiation reaches a level that would damage an uncoated ceramic. The coated ceramic substrate tape may then be divided and assembled into multi-layer monolithic capacitors. In a related embodiment, the metallic electrodes may be sputtered onto a plastic carrier film to form a transferable layer or decalcomania, with the electrodes later transferred to the surface of the ceramic substrate.

26 Claims, 3 Drawing Sheets

METHOD FOR MANUFACTURING ELECTRODES FOR MULTILAYER CERAMIC CAPACITORS this application is a continuation of application Ser. No. 07/610,780, filed Nov. 8, 1990.

BACKGROUND OF THE INVENTION

This invention relates in general to the manufacture of monolithic capacitors and, more specifically, to the production of metal electrodes on ceramic dielectric substrates for such capacitors.

Conventional multilayer capacitors generally consist of a number of alternate layers of conductive metal electrodes and dielectric layers, all connected in parallel so as to provide an increase in the electrical capacitance for a given area. This structure is generally referred to as a monolithic construction of electrodes and dielectrics or as a monolithic capacitor. The dielectric may be an insulating synthetic resin, a ceramic material or other insulator. A variety of conducting materials, typically metals, may be used in the electrodes.

At the present time, the electrodes are formed on a dielectric substrate through a "silk screen" printing process in which a type of printing ink comprising finely divided precious metal particles (typically having diameters of about 1 micrometer) dispersed in a resinous carrier are forced through a screen stencil onto the substrate. The conductive ink is generally deposited to a thickness of at least about 0.001 inch in order to provide the required conductivity. Because of the particulate nature of the conductor and the non-conductive resin matrix, the resulting layer does not have an optimum high conductivity. As the layer is made thinner than about 0.001 conductivity decreases to an undesirable degree, decreasing at an exponential rate until substantially zero conductivity results when the layer has a thickness substantially equal to the metal particle diameter. With 1 micrometer (0.0004 inch) particles, about 25 layers of particles are required to provide the necessary 0.001 inch thickness. Such electrodes have been found to be effective with dielectric substrates which also have thicknesses of about 0.001 inch.

Recently, dielectric materials have been developed which are effective even when used in sheets much thinner than 0.001 inch. Unfortunately, when capacitors having thick conductive electrodes on thin dielectric sheets are stacked to form multi-layer capacitors, the sheets do not conform well to the edges of the electrodes, leaving voids and sharp edges which are conducive to electrical breakdown of the capacitor in use.

Thus, the present methods of using silk screened capacitors with relatively thick electrodes and substrates tend to produce multilayer capacitors which are undesirably thick and undesirable for use with miniaturized electronic assemblies.

While silk screening remains the customary method of fabricating multilayer capacitors, attempts have been made to use other methods for applying a conductive layer to form the electrodes.

As described by Behn et al. in U.S. Pat. No. 4,376,329, simple capacitors have been made by vacuum evaporating a metal such as aluminum onto a substrate, followed by forming a layer of synthetic resin by gas polymerization, then vacuum evaporating another metal layer. This method is complex and cannot effectively produce multilayer ceramic capacitors comprising alternate layers of metal and ceramic dielectrics at high rates.

Another method of producing laminated capacitors is described by Behn in U.S. Pat. Nos. 4,378,382 and 4,508,049. Here, carriers are located in recesses in a drum, which is rotated to move the carriers alternately through vacuum chambers which deposit a metal such as aluminum, then a synthetic resin dielectric, by vacuum deposition. This is another complex system, requiring complex seals where the drum enters and leaves the vacuum chambers. This method does not seem adaptable to ceramic dielectrics and precious metal electrodes in high temperature resistant capacitors.

Thus, there is a continuing need for methods and apparatus for producing high temperature resistant monolithic capacitors using thin ceramic dielectric substrates and thin precious metal electrodes.

SUMMARY OF THE INVENTION

An object of this invention is to provide a method and apparatus for manufacturing thinner electrodes and dielectric substrates for use in multilayer capacitors. Another object of this invention is to prepare capacitor electrodes having improved conductivity in very thin layers. A further object of this invention is to manufacture capacitor electrodes having greater surface contact efficiency between electrode layer and ceramic substrate.

Yet another object of this invention to manufacture capacitors using smaller amounts of precious metals than prior corresponding capacitors.

The above-noted objects, and others, are accomplished in accordance with this invention, basically, by an overall method which forms multilayer ceramic capacitors in which a plurality of spaced thin electrode layers are formed on ceramic substrates which are stacked to form the multilayer capacitors.

The process of a first, or direct electrode-ceramic sandwich formation, embodiment includes steps of forming a green ceramic substrate on a carrier tape, placing a stencil web having openings corresponding to the desired electrode areas to be formed on the substrate in engagement with the substrate, and moving this sandwich in registration through a sputtering chamber in which the desired metals are transferred from a target source through the stencil to the substrate. This method may be followed by conventional capacitor manufacturing steps of heat treating the coated substrate to cure the green ceramic, dividing the now coated substrate into appropriate sections, stacking the electrode coated substrate sections and electrically interconnecting the electrodes to form multilayer, monolithic capacitors.

In order to prevent damage to the somewhat fragile green ceramic during sputtering it is highly desirable that an initial, very thin, coating of metal be formed at low energy levels, to prevent the thermal energy that accompanies sputtering from significantly damaging the substrate. Once the thin, reflective, metal layer is formed, full power sputtering may be conducted, since the reflective layer will reflect thermal radiation away from the substrate. As is detailed below, one convenient method of producing this initial reflective metal layer is to bring the stencil covered substrate into the sputtering chamber in a manner which initially has the substrate at a greater distance from the sputtering target, then bringing the substrate closer to the target after the reflective layer is formed for full power sputtering.

In a second embodiment of our basic method, the decalcomania method, the electrode material may be sputtered onto a pressure sensitive plastic film on a thicker, sturdy, plastic film carrier instead of directly on the ceramic substrate. The ceramic layer is formed over the sputtered electrodes on the film. A selected area of the resulting sandwich of ceramic, electrodes, pressure sensitive film and carrier film is punched from the overall sheet.

The punching action loosens the carrier film much like a decalcomania, which can be easily picked off of the sandwich. A selected number of the punched areas are stacked and pressed under substantial pressure to produce final multilayer ceramic capacitors.

BRIEF DESCRIPTION OF THE DRAWING

Details of the invention, and of certain preferred embodiments thereof, will be further understood upon reference to the drawing, wherein.

DETAILED DESCRIPTION OF PREFERRED EMBODIMENTS

Figure 1:
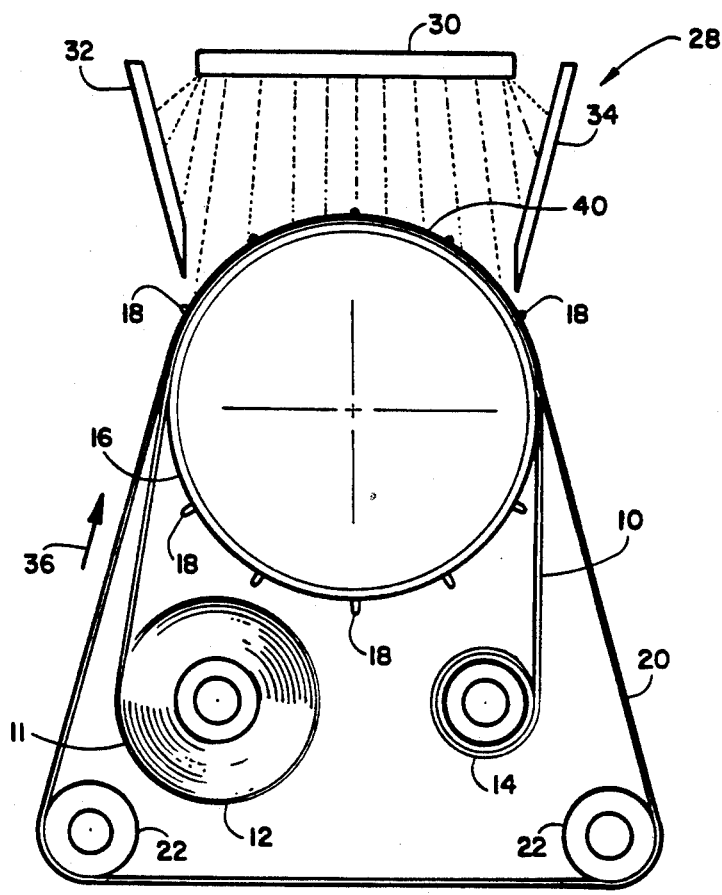
FIG. 1 is a schematic elevation view of the apparatus for manufacturing the capacitor electrode structures.

Referring now to FIG. 1, there is seen an apparatus for forming metal electrode coatings onto a green ceramic substrate 11 coated on tape 10. Tape 10 is fed from a supply roll 12, through the apparatus to a take-up roll 14. Typically, these rolls 12 and 14 may have diameters of about 10 inches, with the tape rolled on about 4 inch hubs. Since the tape and ceramic substrate are very thin (typically about 2 or 3 mils thickness), a roll having a length of about 2000 feet can be accommodated. Tape 10 is passed around drum 16 between rolls 12 and 14. A series of pin holes (not seen) are provided along the edges of the tape which engage registration pins 18. Drum 10 is rotated at a selected speed by a conventional drive means, not shown, which withdraws tape 10 from supply roll 12. Take-up roll 14 is also rotated to smoothly take up tape leaving drum 16.

A continuous stencil web 20 (as seen in greater detail in FIG. 2) is entrained around drum 16 and two idler rolls 22. Registration holes 24 are provided along the edges of web 20, corresponding to the edge holes along the edges of tape 10 and registration pins 18 on drum 16. Holes 24 serve to drive the web in the loop around drum 16 and to maintain precise registration between stencil web 20 and tape 10. Stencil web 20 has a pattern of stencil apertures 26 corresponding to the desired electrodes to be formed on the ceramic substrate carried by tape 10. Typically, web 20 may have a width of about 5 inches, with three rows of stencil apertures 26.

A sputtering chamber, generally designated 28, is located adjacent to drum 16 opposite the sandwich of the ceramic substrate layer on tape 10 and stencil web 20. The entire apparatus, which may typically have an overall width of about 21 inches and height of about 36 inches, may be enclosed in a conventional vacuum vessel (not shown). Typically, the vessel is evacuated to a pressure of from about $5 \times 10^{-4}$ to $5 \times 10^{-9}$ mmHg, then backfilled with an inert gas such as argon at a pressure of from about $10^{-2}$ to $10^{-4}$ mmHg and maintained in that pressure range.

Chamber 28 basically includes a sputtering target 30 from which metal atoms are propelled toward the sandwich on drum 16 in a conventional manner and shields 32 and 34 which prevent spread of the sputtered atoms away from the sandwich. Any suitable sputtering system of the many well known in the art may be used.

Sputtering is the rather graphic term describing the process of disintegrating a solid surface by bombarding ions accelerated toward the surface by a high voltage. The momentum of the impacting ions is transferred to the surface atoms, ejecting them with fairly high velocities of their own. The ejected atoms are here deposited on the ceramic substrate in the stencil openings 26 and on the stencil itself between openings. A thin film is thus deposited atom-by-atom. Since sputtering is a non-evaporative process, high melting point materials can be deposited. In the present case, the sputtered metals must have melting points sufficiently high to avoid any damage to the electrodes during later firing of the green ceramic substrate which may require temperatures well above 1000°^C. It is also possible with sputtering to transfer an alloy from the target to the substrate without changing the alloy composition.

In the past, sputtering was a relatively slow process. With diode systems, deposition was limited to about 200 to 500 Angstroms per minute. We have found that with "planar magnetron" sputtering relatively thick films can be formed at acceptable rates, since deposition rates as high as 20,000 angstroms per minute are possible. Thus, we prefer to use a conventional planar magnetron system to produce the flow of metal atoms from target 30 to the surface of the stencil web 20 and ceramic substrate 10 through openings 26. A layer of metal will build up on web 20, eventually limiting its flexibility. The web is then replaced and the metal coating recovered from the web.

Since the green ceramic comprises ceramic particles in a resin matrix, high temperatures during sputtering can damage the green ceramic surface. Significant thermal energy is emitted by target 30 during sputtering. We have found that the green ceramic surface can be protected by forming a thin reflective metal layer on the ceramic prior to exposure of the ceramic substrate to full power sputtering. As seen in FIG. 1, as the sandwich of tape 10 and stencil web 20 moves in the direction of arrow 36 and passes shield 32, the sandwich is initially exposed to atoms and thermal energy at point 38 at a relatively great distance from target 30. The ceramic substrate within stencil opening 26 thus receives an initial very thin coating of metal at lower energy levels, then is capable of reflecting thermal energy when the full power sputtering region around point 40 where drum 16 most closely approaches target 30.

While the drum arrangement shown is strongly preferred for simplicity, convenience and effectiveness, other curved surfaces providing a similar effect of gradually introducing the substrate to the full sputtering may be used, if desired. Tracked belts bearing registration pins could be used to move the sandwich of tape and web over such a surface.

If desired, this differential initial coating effect can be further varied by tilting the target 30 s as to be spaced further from drum 16 at the incoming end, by moving target further to the right as seen in FIG. 1, by changing the diameter of drum 16, etc. With particularly sensitive green ceramic materials, it is also possible to run the tape and stencil web sandwich through the apparatus once at a very low sputtering energy rate to form a very thin reflective metal layer, then repeat the process at full power levels, since the registration pin system will maintain accurate registration during the two passes. This alternative is, of course, considerably slower than our preferred method.

The various components of this system may be made from any suitable material. Polyester film is preferred for use in stencil web 20 and the tape 10 carrying the ceramic substrate for flexibility, toughness and resistance to the temperatures involved. The green ceramic layer preferably comprises finely divided dielectric ceramic particles, typically formed from oxides of metals such as barium, strontium, titanium or mixtures thereof, having average diameters of from about 0.5 to 2.0 microns dispersed in a resin matrix in a weight ratio of typically about 50 wt% resin to about 50 wt% ceramic. Typical resins include vinyl polymers and acrylic polymers, typically plasticized with toluene or ethanol solvents. The resinous material typically comprises about 20 wt% resin and about 80 wt% solvent and has a consistency similar to that of conventional house paint. The ceramic-resin mixture is typically slip cast to form layer 11 on tape 10, which may be any suitable film, such as polypropylene. While any desired metal may be deposited on the ceramic substrate by the sputtering process, we prefer an alloy of palladium and silver or pure palladium in most cases. Other metals such as platinum or gold which have melting points above the firing temperature of the green ceramic, typically about 1200° C. may be used as desired.

Figure 3:
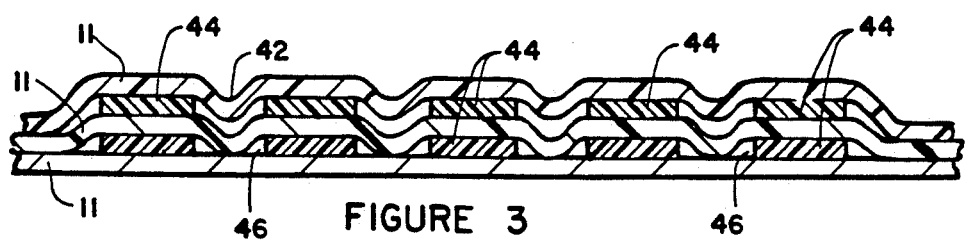
FIG. 3 is a schematic vertical section view through a typical monolithic capacitor produced by the direct electrode-ceramic method of this invention.

Once the metal layer has been applied, the green ceramic is stacked and fired in a conventional manner to form a monolithic capacitor as schematically shown in vertical section in FIG. 3. The ceramic substrate layers 40 deform to fill spaces between adjacent area 42 of conductor 44. While relative thicknesses of the layers in this schematic illustration are somewhat exaggerated for clarity, small voids 46 can be seen where the ceramic layer 11 bends over the edge of conductor 44. Excessive void volume is disadvantageous to the electrical characteristics of the capacitor. As discussed above, with the prior silk screened conductors, where the ceramic typically has a thickness about 5 times that of the conductor, these voids will be undesirably large. Where the conductor is equal to 1/10 the thicknesses of the substrate, these voids will be very small.

A second embodiment of the method for making electrodes for multilayer ceramic capacitors is schematically illustrated in FIGS. 4–8. This method preferably uses the apparatus illustrated in FIG. 1, with variations in materials and processing steps Initially, a thin (typically about 2 mils thick) film 50 of a pressure sensitive resin material, such as a vinyl or acrylic polymer in an ethanol or other alcohol, solvent is cast onto the surface of a relatively thick carrier film 52 said film 50 having a slightly tacky free surface. Film 50 has a very smooth upper surface. For convenience during later firing steps, it is advantageous to use the same resin for pressure sensitive adhesive layer 50 as is used for the ceramic particle binder resin. Carrier film 52 is typically formed from a polystyrene or polypropylene resin having a thickness of about 2 mils. Carrier film 52 may have the configuration of tape 10 in FIG. 1 may have registration holes as shown at 24 in FIG. 2.

Figure 2:
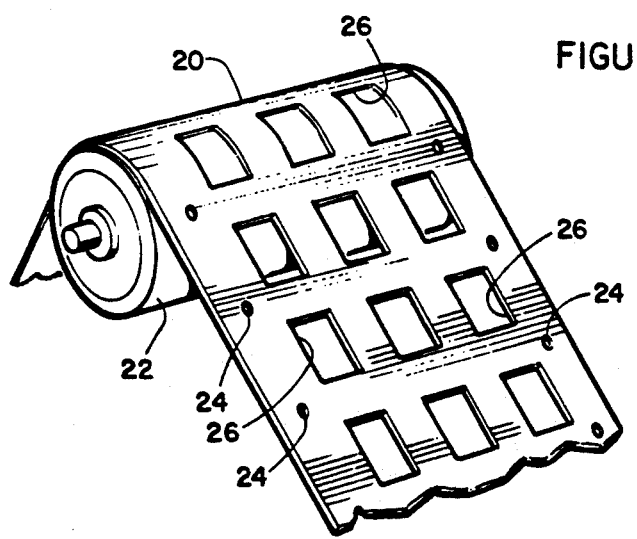
FIG. 2 is a schematic perspective view of a stencil sheet.
Figure 4A:
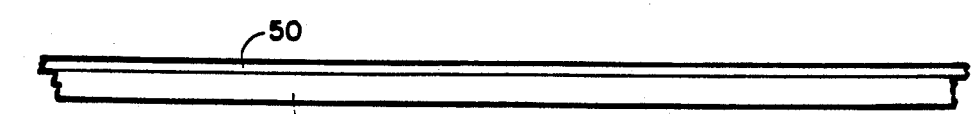
FIG. 4a is a schematic elevation view illustrating the first step of the decalcomania embodiment, forming the pressure sensitive film.
Figure 4B:
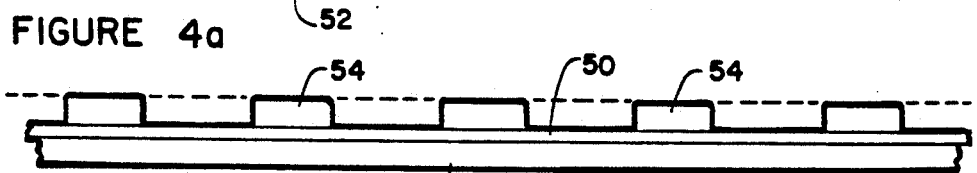
FIG. 4b is a schematic elevation view illustrating the second step, applying the stencil.

As seen in FIG. 4b, a stencil 54 is placed over pressure sensitive film layer 50. Stencil 54 may have a configuration similar to stencil 20 as seen in FIG. 2. The pressure sensitive adhesive characteristics of film 50 will releaseably hold stencil thereto during processing.

Figure 4C:
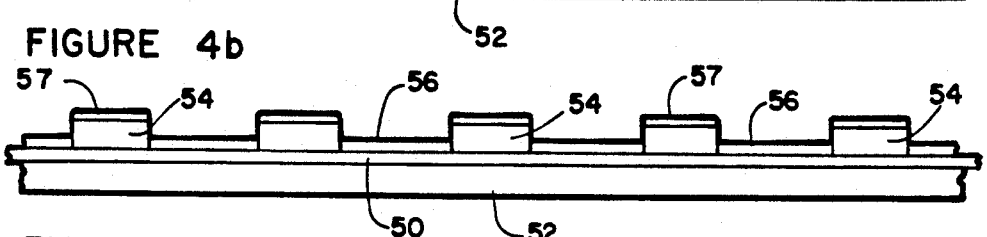
FIG. 4c is a schematic elevation view illustrating the third step, sputtering the electrodes.

A metal electrode layer 56 is then sputtered over the sandwich as shown in FIG. 4c in the manner discussed above, typically using an apparatus as shown in FIG. 1. As detailed above, any suitable metal may be formed to any suitable thickness. Metal coated on the stencil as shown at 57 will be recovered for reuse. The lower surface of metal layer 56 is very smooth, conforming to the mirror smooth surface of film 50 which ideally will have and average discontinuities of less than 0.1 of a micron. The smooth layer 54 of very uniform thickness can be made much thinner than could a layer having two very rough surfaces and still provide the desired conductivity. Where the surfaces are both rough, the average thickness of a very thin layer will vary widely, where the surface roughness is a large proportion of the layer thickness. Thus, the average thickness of a rough layer is much less than the maximum thickness, so that thicker layers are required to provide the desired minimum conductivity. Since our conductive electrode layer 56 can be made thinner, the overall thickness of a multilayer capacitor will be much less, an important advantage in small electronic devices.

Figure 4D:
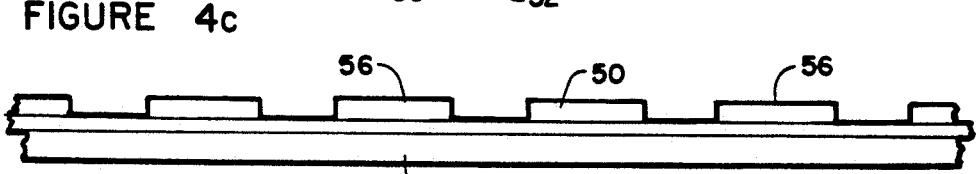
FIG. 4d is a schematic elevation view illustrating the fifth fourth step, removing the stencil.

Stencil 54 is then removed as indicated in FIG. 4d, leaving the decalcomania assembly of electrodes 56 on adhesive film or layer 50 on carrier film 52. If desired, the process may immediately continue or the assembly may at this time be rolled up and stored and the following steps may be accomplished at a later time.

Figure 4E:
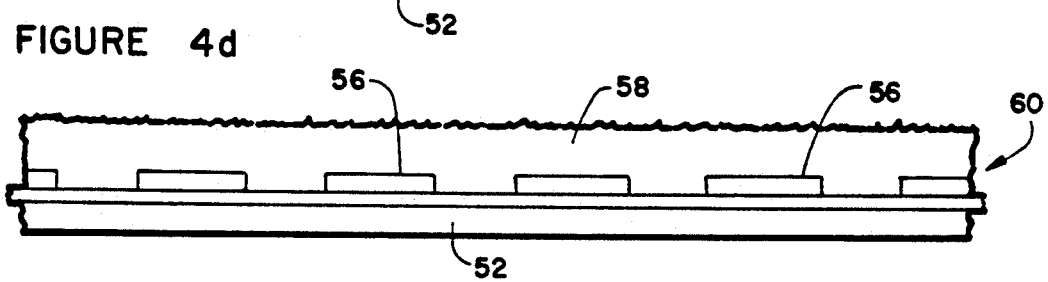
FIG. 4e is a schematic elevation view illustrating the fifth step, applying the ceramic material.

A green ceramic mixture of the sort described above is then slip cast over the electrode surface as indicated in FIG. 4e. The green ceramic layer 58 is dried, forming a unitary sandwich 60 which can be stored prior to capacitor manufacture. The layer 58 is well bonded to pressure sensitive layer 50, particularly where the ceramic layer binder and layer 50 have the same or similar composition. The upper surface of ceramic layer 58 is relatively rough, while the surface engaging layer 50 tends to be very smooth, replicating the smooth upper surface of layer 50.

Figure 5:
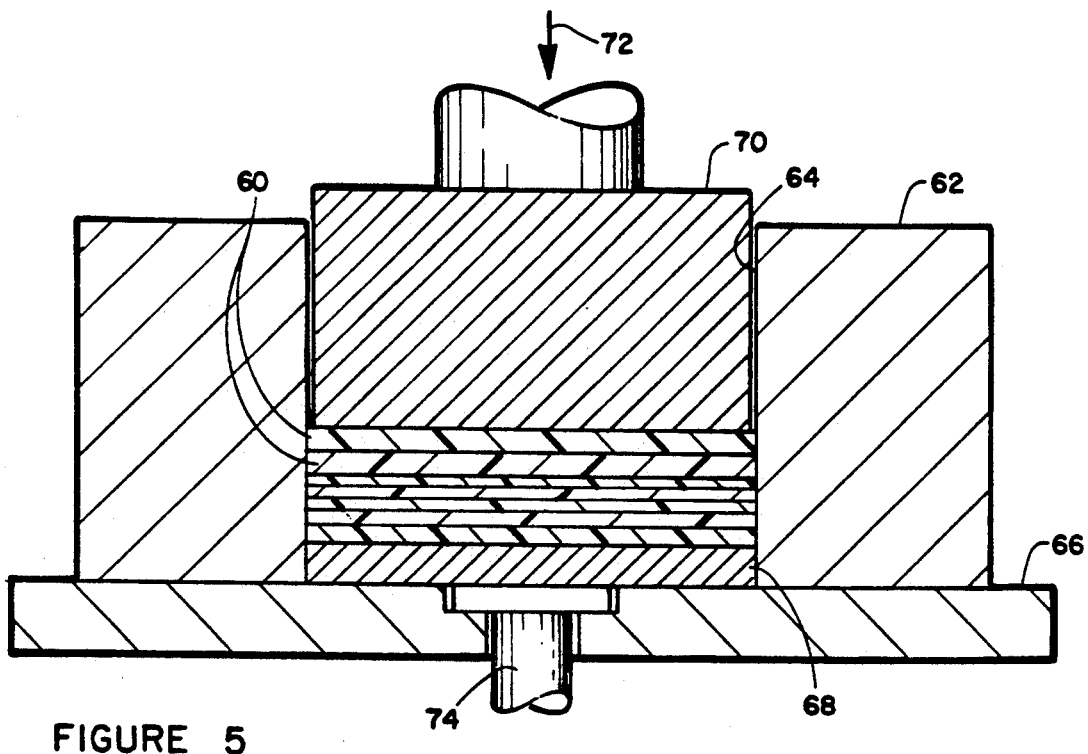
FIG. 5 is a schematic elevation view of apparatus for laminating a stack of layers as formed in the step of FIG. 4e.

A punch assembly for punching areas out of sandwich 60 and assembling them in alignment is schematically illustrated in Figure 5. A die 62 having a cavity 64 of generally rectangular cross section is mounted on a base 66. A base plate 68 conforming to cavity 64 is placed against base 66 within cavity 64. A punch 70 shaped to fit into cavity 64 is positioned above cavity 64 A force indicated by arrow 72 is adapted to press punch 70 down into cavity 64. In operation, punch 70 is removed from cavity 64, a portion of sandwich 60 is placed in a selected alignment across the entrance to cavity 64 with ceramic layer 58 downwardly and punch 70 is forced into cavity 64, severing that portion of sandwich 60 spanning cavity 64 and forcing it down into the cavity. The initial punching action loosens carrier film 52 from pressure sensitive layer 50, so that when punch 72 is withdrawn from the cavity, carrier film 52 can be easily picked out of the cavity with tweezers or the like. This decalcomania separation at the pressure sensitive layer 50 makes for very convenient manufacture. The next portion of sandwich 60 is moved into position and the punching and carrier film removal steps are repeated. Many such sections of sandwich 60 are punched into cavity 64 in accordance with the particular size capacitor being constructed. Once the required number of sandwich pieces have been punched, the resulting stack is subjected to heavy pressure, on the order of about 1000 pounds per square inch or greater. The resulting well consolidated bar is removed from cavity by moving ejector pin upwardly against base plate 68.

Figure 6:
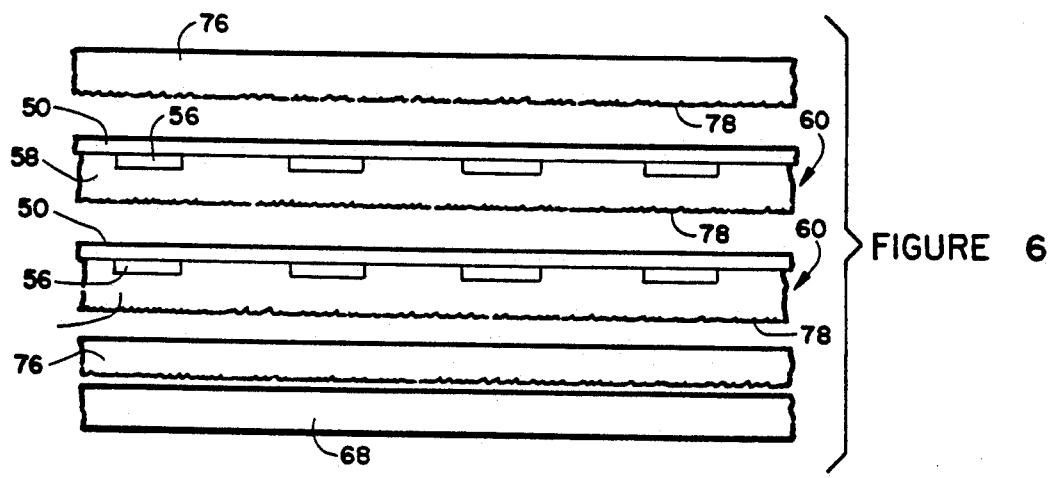
FIG. 6 is a schematic vertical section view through the stack shown in FIG. 5, prior to pressing.

FIG. 6 illustrates a preferred stack arrangement, showing the individual sections of sandwich 60 slightly spaced for clarity. Preferably, a blank layer of ceramic dielectric 76 is initially punched into the cavity to provide an outer surface on the final capacitor. As each succeeding sandwich 60 section is pressed against the preceding section, the rough outer layer 78 of ceramic layer 58 is pressed into the adjacent pressure sensitive film 50 of the next sandwich 60, providing excellent adhesion. Also, if the outer rough layer 78 is slightly deficient in binder resin, forcing it into the adjacent resin layer will make up for any such lack. The stack is completed by adding a final blank dielectric ceramic layer 76, with the rough side 78 down to assure good adhesion to uppermost layer 50. Since each electrode 56 is fully embedded between layers of pressure sensitive resin 50 and ceramic 58 prior to pressing, proper final placement of electrodes with respect to each other is assured.

Figure 7:
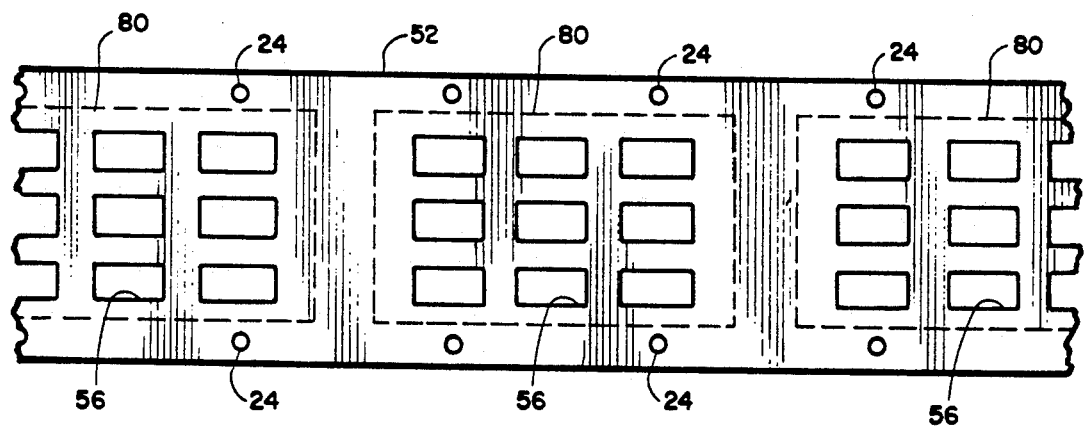
FIG. 7 is a schematic plan view of the overall electrode sheet showing typical pre-press areas.
Figure 8:
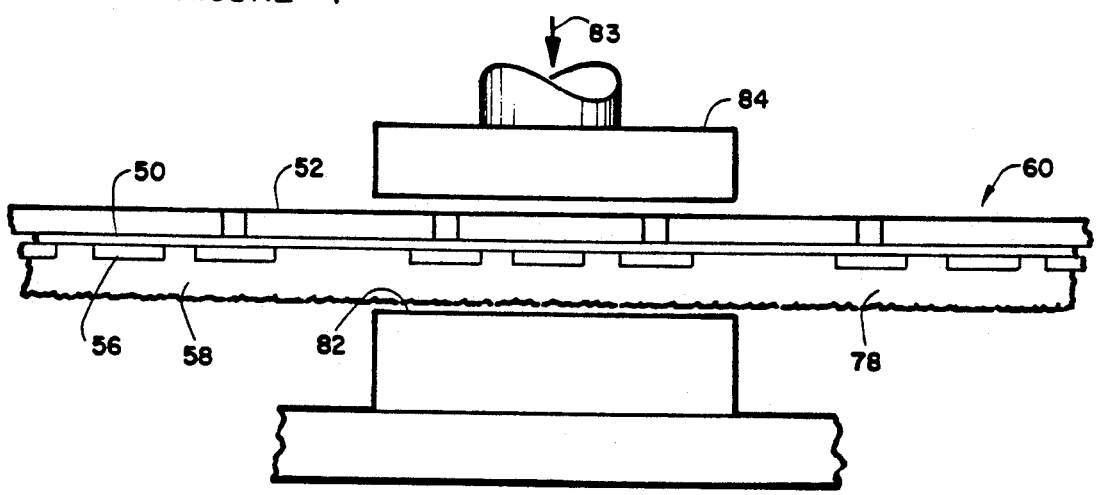
FIG. 8 is a schematic elevation view illustrating the prepressing step.

In some cases, where a very thick multi-layer capacitor is being formed, it has been found that the initial punching pressure imposed on each newly punched section may not be sufficient to properly loosen carrier film 52 from pressure sensitive layer 50, to allow the carrier film piece to be easily picked out of the cavity. This problem seems to be the result of the resilience of the stack already in the cavity. In that case, we prefer to pre-press an area 80 (as seen in FIG. 7) approximately conforming to the cavity area immediately prior to the punching step. Capacitor areas 56 can often be seen in the plan view, since the carrier film 52 is often transparent. This pre-pressing is accomplished simply by moving sandwich 60 between flat surface 82 and flat punch 84 and bringing them together with sufficient force, as indicated by arrow 83, to loosen the bond between carrier film 52 and pressure sensitive film 50 in the desired area. Preferably, pre-pressing is accomplished at pressures of from about 1000 to 5000 pounds per square inch. The entire sandwich tape cannot be pre-pressed, such as by passing the tape between rollers, since premature separation would occur, preventing proper alignment of each succeeding section over the cavity. With the local area pre-pressing, the unpressed areas around and between sections will act as supports keeping the loosened center sections in place until punching occurs at the pressure cavity.

This second embodiment, while slightly more complex, has advantages in that each electrode 56 is formed between two smooth surfaces and is fully embedded during further processing, while that of the embodiment of FIGS. 1-3 has the electrodes sputtered on the rough surface of the ceramic substrate.

While the certain preferred materials, relationships and configurations were detailed in the above description of preferred embodiments, those can be varied, where suitable, with similar results. Other variations, applications and ramifications of this invention will occur to those skilled in the art upon reading the present disclosure. Those are intended to be included within the scope of this invention as defined in the appended claims.

We claim:

1. The method of manufacturing conductor sheets suitable for use in monolithic capacitors which comprises the steps of:

providing a carrier film;

forming a thin, smooth, layer of a pressure sensitive resin film on said carrier film, said pressure sensitive film having a slightly tacky free surface;

placing a stencil web in contact with said slightly tacky free surface to form a first sandwich, said stencil web having a plurality of rows and columns of openings, each opening surrounded by said web and corresponding to a desired conductor area;

moving said first sandwich through a sputtering region past a spluttering target wherein atoms emitted by said sputtering target space said stencil web;

moving said sandwich through said sputtering region at a rate which will permit a metal electrode layer of selected thickness to build up on said pressure sensitive resin film within each stencil opening;

removing said stencil from said slightly tack free surface; and forming a layer of dielectric ceramic material on the surface from which the stencil was removed and the surface of said electrode layers to form a unitary sandwich;

removing said carrier film from said unitary sandwich whereby a conductor sheet having conductor layers with very smooth surfaces results.

2. The method according to claim wherein said electrode layer has a thickness of from bout 500 to 20,000 Angstroms.

3. The method according to claim 2 wherein said metal is an alloy of about 30 wt% palladium and about 70 wt% silver.

4. The method according to claim 1 wherein said electrode layer has a thickness of about 8000 Angstroms.

5. The method according to claim 1 wherein said stencil web and said carrier film are polyester films having a thickness from about 1 to 10 mils.

6. The method according to claim 5 wherein said stencil web has a thickness of about 3 mils and said carrier film has a thickness of about 2 mils.

7. The method according to claim 1 wherein said pressure sensitive resin resin is selected from the group consisting of vinyl polymers, and acrylic polymers and mixtures thereof, plasticized with a solvent selected from the group consisting of toluene, ethanol and mixtures thereof.

8. The method according to claim 1 wherein said dielectric material is selected from the group consisting of oxides of barium, strontium, titanium and mixtures thereof.

9. A method of manufacturing multilayer conductor bars suitable for use in monolithic capacitors which comprises the steps of:

providing a carrier film;

forming a thin, smooth, layer of a pressure sensitive resin film on said carrier film, said pressure sensitive film having a slightly tack free surface;

placing a stencil web in contact with said slightly tacky free surface to form a film and stencil sandwich, said stencil web having a plurality of rows and columns of openings each opening surrounded by said web and corresponding to a desired conductor area;

moving the resulting film and stencil sandwich through a sputtering region past a spluttering target wherein atoms emitted by said sputtering target impact said stencil web;

moving said film and pencil sandwich through said sputtering region at a rate such that a metal electrode layer of selected thickness builds up on the pressure sensitive film surface within each stencil pening;

removing said stencil from said lightly tack free surface;

forming a layer of dielectric ceramic material on the surface from which the stencil was removed and the surface of said electrode layers to form a multilayer sandwich;

orienting the multi-layer sandwich over a punch cavity of selected area, said carrier film oriented away from said cavity;

punching said area from said multi-layer sandwich with sufficient impact to loosen said carrier film from said pressure sensitive film;

removing said loosened carrier film from said cavity;

repeating said punching and carrier film removal steps with at least on additional multi-layer sandwich area to form a stack of multi-layer sandwich areas within said cavity; and applying sufficient pressure to the resulting stack of multi-layer sandwich areas in said cavity to consolidate said areas into a monolithic bar, whereby a multilayer conductor bar having a plurality of electrode layers with very smooth upper and lower surfaces results.

10. The method according to claim 9 including the further step of pre-pressing discrete areas of said multilayer sandwich over areas substantially corresponding to the areas to be punched, whereby said carrier film is loosened from said pressure sensitive film in only those areas prior to said orienting step.

11. The method according to claim 10 wherein said metal is an alloy of about 30 wt% palladium and about 70 wt% silver.

12. The method according to claim 9 further including the steps of placing sheets of said ceramic material free of electrode and pressure sensitive layers in said punch prior to punching the first multi-layer area and prior to the final consolidation pressing.

13. The method according to claim 9 wherein said consolidation pressing is at a pressure of at least about 1000 pounds per square inch.

14. The method according to claim 10 wherein said prepressing is at a pressure of from about 1000 to 5000 pounds per square inch.

15. The method according to claim 9 wherein said electrode layer has a thickness of from about 500 to 20,000 Angstroms.

16. The method according to claim 9 wherein said electrode layer has a highly uniform thickness of about 8000 Angstroms and very smooth upper and lower surfaces.

17. The method according to claim 9 where said stencil web and said carrier film are about 1 to 10 mil polyester films.

18. The method according to claim 9 where said stencil web has a thickness of about 3 mils and said carrier film has a thickness of about 2 mils.

19. The method according to claim 9 wherein said pressure sensitive resin film is selected from the group consisting of vinyl polymers, acrylic polymers and mixtures thereof, plasticized with a solvent selected from the group consisting of toluene, ethanol and mixtures thereof.

20. The method according to claim 9 wherein said ceramic material is selected from the group consisting of the oxides of barium strontium titanium and mixtures thereof.

21. The method according to claim 9 wherein said thin layer of a pressure sensitive resin film on said carrier film has a mirror smooth surface with discontinuities of less than 0.1 microns.

22. The method of manufacturing multilayer conductor bars suitable for use in monolithic capacitors which comprises the steps of:

providing a carrier film having a smooth surface;

placing a stencil web in contact with said smooth carrier film surface to from a film and stencil sandwich, said stencil having a plurality of rows and columns of openings each opening surrounded by said web, each opening corresponding to a desired conductor area;

moving said film and stencil sandwich through a sputtering region past a sputtering target wherein atoms emitted by said sputtering target impact said stencil web;

moving said film and stencil sandwich through said sputtering region at a rate such that an electrode layer of selected thickness builds up on the smooth carrier film surface within each pencil pening;

removing said stencil from said smooth carrier film surface;

forming a layer of dielectric ceramic material on the surface from which the stencil was removed and the surface of said electrode layers to form a multi-layer sandwich;

orienting said multi-layer sandwich over a punch cavity of selected area, said carrier film oriented away from said cavity;

punching said area from said multi-layer sandwich and into said cavity to release said carrier film from said multi-layer sandwich;

removing said loosened carrier film from said cavity;

repeating said punching and carrier film removal steps with at least one additional multi-layer sandwich area to form a stack of multi-layer sandwich areas; and applying sufficient pressure to the resulting stack of multi-layer sandwich areas in said cavity to consolidate said areas into a monolithic bar whereby a multilayer conductor bar having a plurality of electrode layers having very smooth upper and lower surfaces results.

23. The method according to claim 22 including the further step of pre-pressing discrete areas of said sandwich over areas substantially corresponding to the areas to be punched prior to said orienting step.

24. The method according to claim 22 further including the steps of placing sheets of said ceramic material in said punch prior to punching the first sandwich area and prior to said consolidation pressing.

25. The method according to claim 22 wherein said consolidation pressing is at a pressure of at least about 1000 pounds per square inch.

26. The method according to claim 22 wherein said pre-pressing is at a pressure of from about 1000 to 5000 pounds per square inch.

* * * * *